United States Patent [19] [11] Patent Number: 4,574,383
Irie et al. [45] Date of Patent: Mar. 4, 1986

[54] DECODER OF ADAPTIVE DIFFERENTIAL PULSE CODE MODULATION

[75] Inventors: Kazunari Irie, Tokyo; Masahiro Taka; Hideyo Murakami, both of Kanagawa, all of Japan

[73] Assignee: Nippon Telegraph & Telephone Public Corporation, Tokyo, Japan

[21] Appl. No.: 558,194

[22] Filed: Dec. 5, 1983

[30] Foreign Application Priority Data

Dec. 6, 1982 [JP] Japan .................................. 57-213602

[51] Int. Cl.⁴ .............................................. H04B 14/06
[52] U.S. Cl. ...................................... 375/27; 332/11 D
[58] Field of Search ....................... 375/27, 28, 30, 31; 358/13, 135, 132, 138; 332/11 D

[56] References Cited

U.S. PATENT DOCUMENTS 3,689,840 9/1972 Brown et al. ........................... 375/27
4,385,393 5/1983 Chaure et al. .......................... 375/30
4,411,001 10/1983 Van Buul et al. ...................... 375/30
4,488,175 12/1984 Netravali ................................ 375/27

Primary Examiner—Robert L. Griffin
Assistant Examiner—Stephen Chin
Attorney, Agent, or Firm—Cushman, Darby & Cushman

[57] ABSTRACT

A transcoder which transcodes adaptive differential pulse code modulation (ADPCM) signals to pulse code modulation (PCM) signals without cumulative transcoding noises even if mutual transcoding between ADPCM signals and non-linear PCM signals is repeatedly conducted. Two PCM signals are generated having values of one step higher and one step lower than a third PCM signal having a nominal code value. The three signals are fed to a selector, which sequentially selects one of the three. The output of the selector is then decoded and fed to one input of a subtractor, and a prediction signal is fed to the other input of the subtractor. The output of the subtractor is coded into an ADPCM signal in a step size of the input ADPCM signal. The logical value of that coded ADPCM signal is compared with the logical value of the input ADPCM signal by a comparator. A gate allows the PCM signal output from the selector to pass only when the comparator has an equal output.

6 Claims, 5 Drawing Figures

DECODER OF ADAPTIVE DIFFERENTIAL PULSE CODE MODULATION

FIELD OF THE INVENTION

The present invention relates to a transcoder for PCM communication systems, and more particularly to a transcoder which transcodes adaptive differential pulse code modulation (hereinafter ADPCM) signals to pulse code modulation (hereinafter PCM) signals without cumulative transcoding noises even if mutual transcoding between ADPCM signals and non-linear PCM signals is repeatedly conducted.

DESCRIPTION OF THE PRIOR ART

The currently available PCM communication system requires a bit rate of 64 kb/s in order to transmit voice for one channel of telephone signal. In such a PCM communication system, it is assumed that there is no correlation to previous sampled values. However, there is correlation to previous sampled values of an actual voice signal and if this correlation is utilized, the bit rate can be reduced, by way of a predicting means, to a lower value such as 32 kb/s or 16 kb/s, thereby economizing the device as well as the transmitting line.

As such a predicting means, there is widely known a linear prediction system which predicts a current value in a linear form using the values previously sampled in the number of N. An adaptive prediction which adaptively varies such linear prediction coefficients according to an input signal has come to be used as a better prediction system.

The present assignee filed a patent application on a DPCM-PCM converter (Japanese Patent Application No. 53-27933 filed on Mar. 11, 1978, hereinafter referred to simply as the prior application) which was laid open on Sept. 19, 1979 (Patent Application Laid Open 54-12057). One of the inventors spoke on the prior application and the technology peripheral thereto at academic conferences:

(1) Murakami: "A Low Noise ADPCM-Log PCM Code Converter" Electronic Communication Association Technology Research Report CS 117, Sept. 25, 1978.

(2) Murakami: A Low Noise ADPCM-Log PCM Code Converter, Proc. 1979, ISCAS (International Symposium on Circuits and Systems) IEEE.

The prior device is shown as a block diagram in FIG. 1. In the figure, signals from coder are sent via 2 a transmission line 2 to a decoder 3. In the coder 1, a signal at an input terminal 11 is coded by a coding circuit 12 as a PCM signal X. The PCM signal X and a prediction signal Y are supplied to a subtracting circuit 13, and the output signal Z therefrom is coded as an ADPCM signal by a coding circuit 14.

In order to form the prediction signal Y, the output ADPCM signal from coding circuit 14 is branched off so as to be decoded by the decoding circuit 15 and added with the prediction signal Y to be fed to a prediction circuit 17. A prediction signal Y is obtained as the output from the fixed prediction circuit 17.

In the decoder 3, the ADPCM signal which has arrived via the transmission line 2 is applied at an input terminal 31, decoded by a decoder 32 to obtain a signal A. The signal A is added in an addition circuit 33 to a prediction signal B generated from a prediction circuit 34 which has the same logic as prediction circuit 17 to obtain a linear digital signal C. The signal C is transcoded by a coding circuit 35 to a PCM signal delivered to output to an output terminal 36. The linear digital signal C is branched off as an input to prediction circuit 34.

The input ADPCM signal is also branched from terminal 31 directly to coding circuit 35 so as to detect whether or not the quantization of the ADPCM signal becomes overloaded, or in other words, to detect whether or not the ADPCM signal displays either a positive or negative maximum level. If the input ADPCM signal is detected as overloaded either positive or negative, a comparison is conducted as shown in the table below. According to the result of the comparison, respective PCM quantization functions Q(C) are selected to be transduced to a PCM signal. If it is detected that the signal is non-overloaded, it is transcoded by means of corresponding PCM quantization functions shown in the table.

TABLE

| ADPCM quantization | PCM quantization | Q(C) |
|---|---|---|
| positive overload | $q(C) - C \geq 0$ | $Q(C) = q(C)$ |
|  | $q(C) - C < 0$ | $Q(C) = q1(C)$ |
| negative overload | $q(C) - C \leq 0$ | $Q(C) = q(C)$ |
|  | $q(C) - C > 0$ | $Q(C) = q2(C)$ |
| non-overload | — | $Q(C) = q3(C)$ | wherein:
$C$ = a linear digital signal
$q(C)$ = a quantization level when the signal C is converted to a non-linear PCM as it is
$q1(C)$ = a quantization level which is larger by one quantization step than $q(C)$
$q2(C)$ = a quantization level which is smaller by one quantization step than $q(C)$
$q3(C)$ = a value having the smallest subtraction from C among $q(C)$, $q(C + \Delta/2)$ and $q(C - \Delta/2)$, provided that $\Delta$ denotes the quantization step size of ADPCM.
$Q(C)$ = non-linear PCM quantization function The operation of the coding circuit 35 is now described qualitatively:

(1) In case of positive overload: the signal after conversion is set at a value larger than the digital signal C.

(2) In case of negative overload: the signal after conversion is set at a value smaller than the digital signal C.

(3) In case of non-overload: the signal after conversion is set at a value, which is selected out of three values of a representative value C of the digital signal before conversion and two ADPCM signal quantization threshold levels above and below the value C, and which is closest to the signal C.

If processing is conducted according to such a logic, no change occurs in the values of the signal before and after transcodings from a PCM signal to an ADPCM signal and again to a PCM signal. Even if such transcoding is repeatedly conducted in a digital communication network, theoretically noises will not accumulate as the value of a signal does not change. This prior art system is, however, not applicable to all algorithms usually used which are adaptive to input signals because the algorithm in the prediction means of the system is structured exclusively to a special algorithm. Since algorithmic processes are necessarily accompanied with operational errors, which due to finite worldlength arithmetic, in respect of quantization characteristics for ADPCM signal coding, and the outputs of the quantization circuit are positioned precisely at the central value of each step, the prior art system may be effective. However, in practice hardware causes cumulative noises even if the above logic is used. More particularly, if the hardware of various devices are ideal, a value closest to the signal C is correctly chosen out of the 3 values, but if there are operational errors in the hardware, and even if a value closest to the signal is selected, this is not necessarily the correct selection. As such transcoding is repeated, everytime data passes through the digital communication network, the value of the signal deviates from the initial value gradually to the extent that cumulative noise is caused.

OBJECTS OF THE INVENTION

The present invention obviates such problems and provides a transcoder which does not accumulate noises by the mutual transcoding between ADPCM and PCM signals even if the device hardware operates with operational errors irrespective of whether the prediction means is a fixed prediction or an adaptive prediction, or irrespective of whether the quantization steps are linear or nonlinear or whatever algorithm it may have.

CHARACTERISTICS OF THE INVENTION

The present invention is structured so that the logic value of signals is not changed, even if transcoding is repeated, by simulating in advance the transcoding from a PCM signal to an ADPCM signal which is to be conducted at the connected coder.

The present invention is characterized in that its structure comprises means to generate PCM signals of the code values one step higher and one step lower than the code value of the output PCM signal from a coding means for PCM signals, means to sequentially select one signal out of three signals, i.e., said PCM signal of one step higher and that of one step lower and a PCM signal of said code value, means to decode the output PCM signal from the selective means, means to calculate the subtraction between the output signal from the decoding means and the output prediction signal from the prediction means, means to code the subtraction into an ADPCM signal in a step size of the input ADPCM signal, means to compare logic value of the output ADPCM signal from the coding means with that of the input ADPCM signal, and gate means which allows the output PCM signal from the selecting means to pass only when the comparative means has an equal output.

This inventon may adopt an adaptive prediction as a prediction means. The invention is further applicable to an ADPCM signal coded by a nonlinear quantization step, which is adaptively controlled by an input signal.

EFFECT OF THE INVENTION

In this invention, transcoding from PCM signal to an ADPCM signal which is to be conducted in the next connected coder is simulated in advance and coincidence of the results of transcoding is confirmed at each step. Therefore, transcoding processing may be smoothly conducted for any algorithm whether the quantization characteristics of the ADPCM signal coding is of a linear, a non-linear or an adaptive type. Even if there are manufacturing deviations in the quantization characteristics in hardware of a repeater, this invention may provide a transcoder which does not cause cumulative noises by repeated mutual transcoding between ADPC signals and PCM signals. The circuits which are to be added for implementation of this invention require no special structure, and they may be simple in structure.

PREFERRED EMBODIMENT

Figure 1:
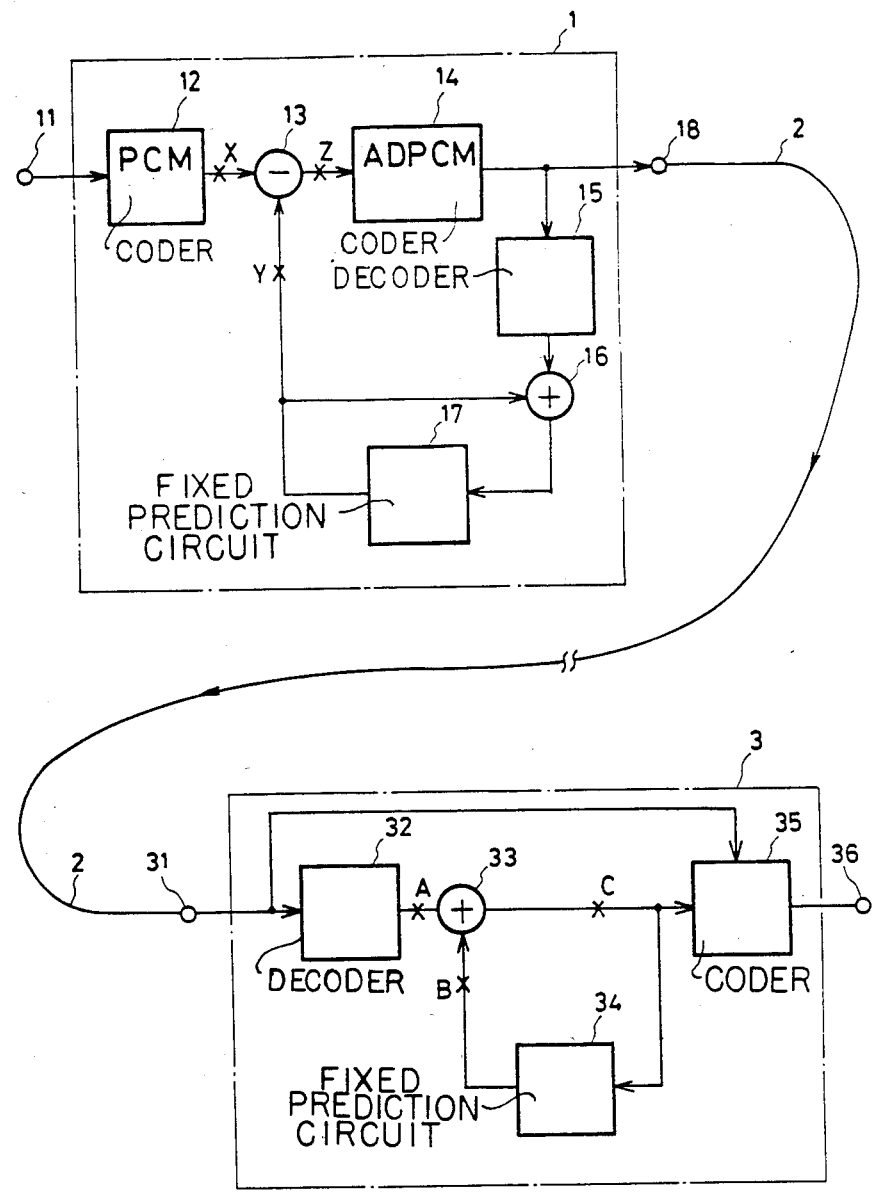
FIG. 1 is a block diagram of a prior art device.
Figure 2:
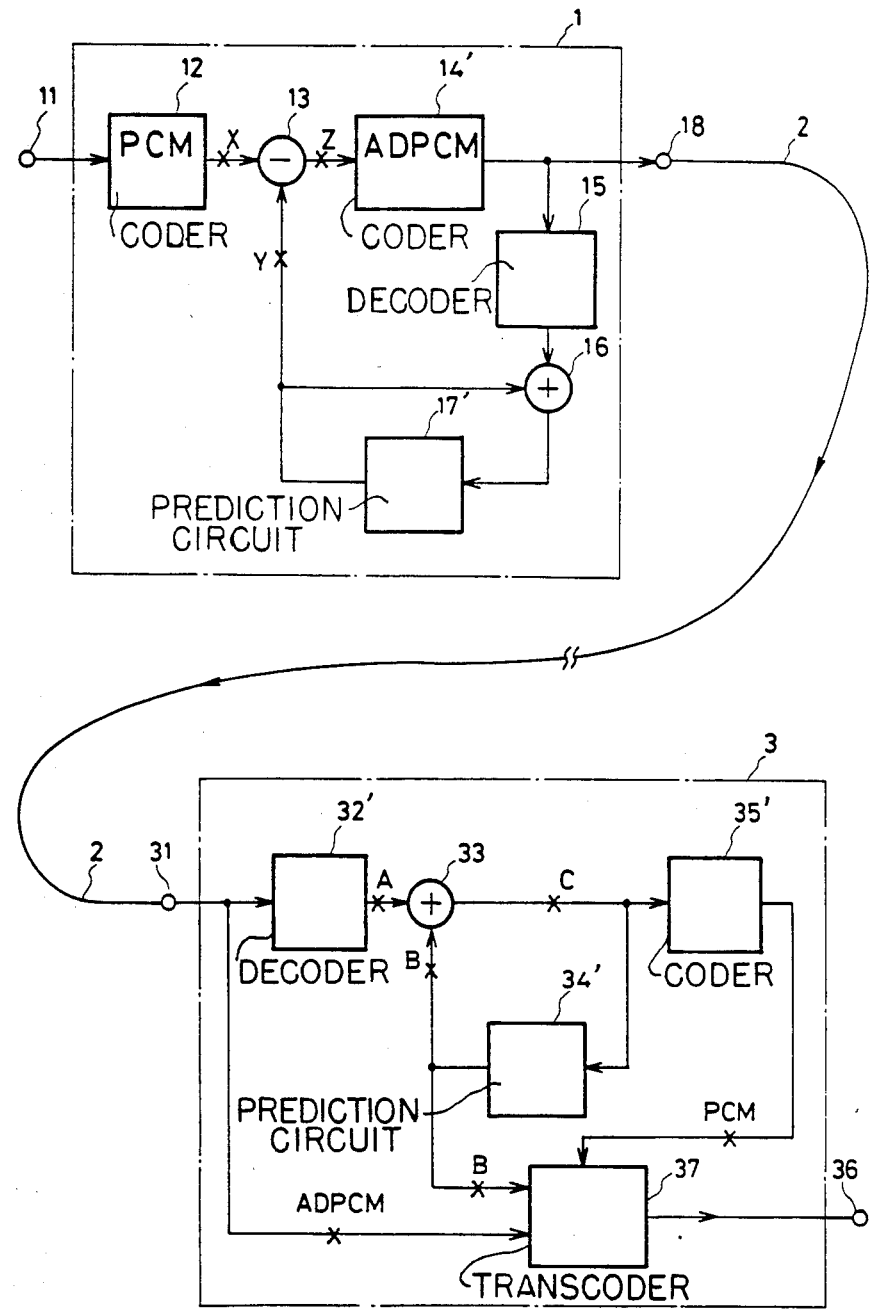
FIG. 2 is a block diagram of an embodiment according to the present invention.

FIG. 2 is a block diagram of a preferred embodiment according to the present invention, wherein like numbers are used for like elements in FIG. 1 the ADPCM coding circuit in coder 1 in FIG. 2 is numbered 14', however, since coding circuit 14' according to this invention may be applied either to a linear type or non-linear type, whereas the prior art system is exclusive for the linear type quantization step. The same is the situation for other elements in FIG. 2 marked with the same number as in FIG. 1 but with an added prime mark ('), i.e., they may be in either a linear or non-linear system. In addition, prediction circuit 17' may also be of the fixed prediction or adaptive prediction type.

Otherwise the arrangement and operation of coder 1 in FIG. 2 is the same as above described for FIG. 1, and an ADPCM signal from output terminal 18 is transmitted via transmission line 2 to decoder 3. A repeater, a switchboard or any other device or devices may be inserted in transmission line 2.

In decoder 3, the ADPCM signal at the input terminal 31 is decoded into a signal A and added with a prediction signal B in adder 33 to obtain a signal C. A prediction circuit 34' generates the prediction signal B. The coding circuit 35' encodes signal C to a PCM signal.

As above noted, the decoding circuit 32', the addition circuit 33, the coding circuit 35' and the prediction circuit 34' are similar to the prior art circuits shown in FIG. 1. The coding circuit 32', however, decodes adaptively to the signals of the input ADPCM adaptive type which are quantized by either a linear or non-linear step. The prediction circuit in coder 3 is designated 34' instead of 34 because this is a circuit of the same logic as prediction circuit 17' which may be either of a fixed prediction or an adaptive prediction. Coding circuit is designated 35' because it does not necessarily have to execute the same processing as in the prior circuit 35 when the input signal C is overloaded. The output PCM signal from the coding circuit 35' is a parallel signal.

In FIG. 2, three signals are applied to transcoding circuit 37: the output PCM signal from the coding circuit 35', the output prediction signal B from prediction circuit 34' and the input ADPCM signal from terminal 31. The output signal from transcoding circuit 37 is connected to the output terminal 36. This transcoding circuit 37 is a feature of the present invention.

Figure 3:
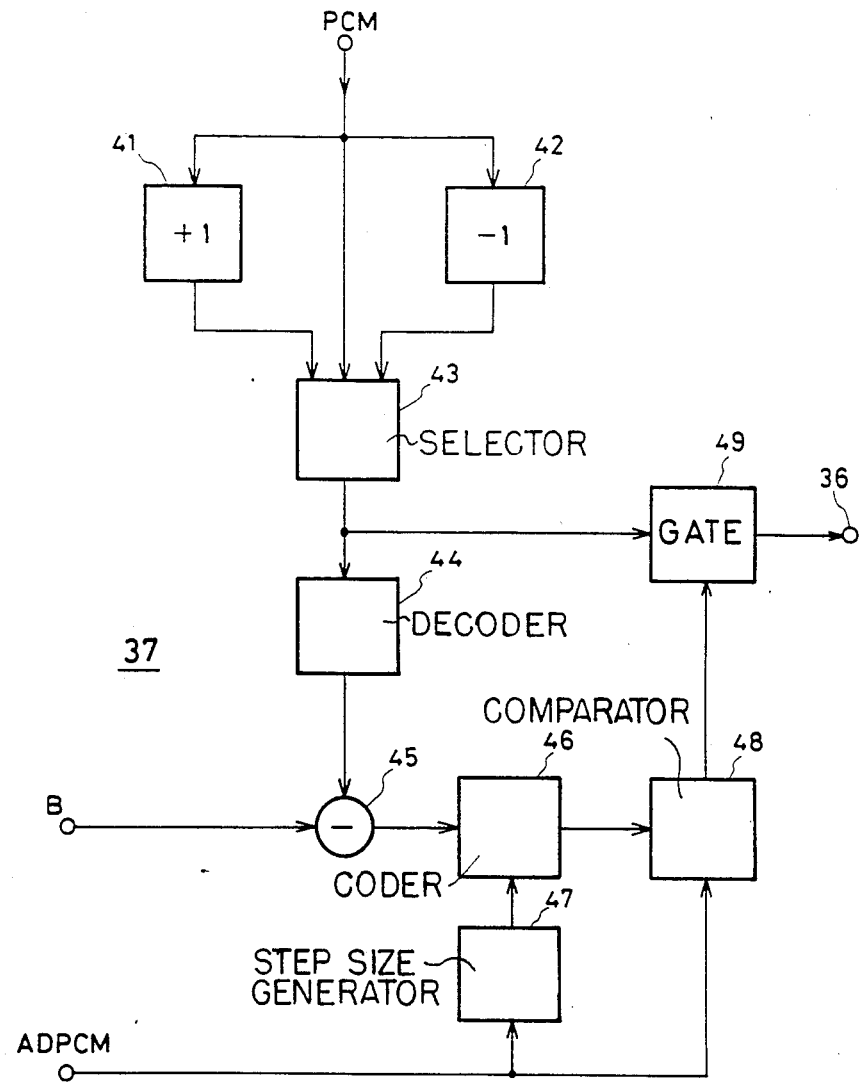
FIG. 3 is a structural view of a transcoder.

FIG. 3 is a block diagram of the transcoding circuit 37. The output PCM signal from the coding circuit 35' is applied as an input to an adder circuit 41, to a subtractor circuit 42 and to a selective circuit 43. The adder circuit 41 generates a PCM signal of a code value which is higher by one step than the code value of the input PCM signal, while the subtractor circuit 42 generates a PCM signal of a code value which is lower by one step than the input PCM signal. Selective circuit 43 selects one out of the three input signals one by one, which selects all of the three signals once per cycle of the input PCM signal and outputs it.

The output PCM signal from the selective circuit 43 is decoded at the decoder circuit 44 and fed to one of the inputs of the subtractor circuit 45. Prediction signal B is fed to another input thereof. The output signal from the subtractor circuit 45 is coded by the coder circuit 46. A step size for the input ADPCM signal is given to the coder circuit 46 from a step size generation circuit 47. The output signal from the coder circuit 46 is connected to one of the inputs of a comparison circuit 48 while the input ADPCM signal is connected to the other input thereof. A gate circuit 49 which is fed with an output signal from the selective circuit 43, is controlled by an equal output from the comparison circuit 48 and becomes enabled only when there is an equal output. The output from the gate circuit 49 is connected to the output terminal 36.

The operation of the device thus structured is now described. The output PCM signal from the coder circuit 35', a PCM signal of the code value which is one step higher than said PCM signal and a PCM signal of the code value which is one step lower than said PCM signal sequentially appear at the output of the selective circuit 43. They are decoded into linear digital signals at the decoder circuit 44 and the subtraction with the prediction signal B occurs in subtractor circuit 45. The subtraction result is coded into an ADPCM signal by a step size of the input ADPCM signal currently at the coder circuit 46. If the ADPCM signal is compared with the input ADPCM signal at the comparison signal, there should be equal ones once in three times.

More particularly, the circuits from the decoder circuit 44 to the coder circuit 46 are the circuits for the PCM-ADPCM transcoding. Therefore, if the PCM signal-ADPCM transcoding of the coder 1 in FIG. 2 and the ADPCM-PCM transcoding from the coder circuit 32' to the coder circuit 35' of the decoder 3 are executed by corresponding logic, the output PCM signal of the coder circuit 35' is probably the same as the PCM signal to the coder circuit 12. If they are not equal, in the ADPCM-PCM transcoding from the coder circuit 32' to the coder circuit 35' in the decoder 3; even if all the circuits are operating correctly, the signal close to the threshold level may possibly be shifted either by one step higher or lower in discrimination. More specifically, it is counter-transcoded to the ADPCM signal once again by means that the output PCM signal from the coder 35' and the prediction signal B are processed, and the resultant signal compared with the input ADPCM signal of the input terminal 31. If they are equal, a PCM signal corresponding thereto is output, and if they are not equal, a PCM signal of the value either one step higher or lower is examined and there must be an equal one. A PCM signal corresponding thereto is sent out. By this arrangement, it is avoided that the code value of a PCM signal is shifted by one step in the process of the ADPCM-PCM transcoding.

Even if the code value of a PCM signal is shifted either up or down by one step but only once, there is no serious problem. As the transcoding and counter-transcoding are repeatedly conducted in the transmission, however, the change will be accumulated gradually to make the signal become an uncomprehensible noise.

The change not only by one step but also by two steps may be accomplished similarly. So far as the transmitting and the receiving devices are processed by the same logic, and all the circuits are normally operated, the code value can not be shifted by more then two steps in discrimination for the transcoding process.

The PCM-ADPCM transcoding from a decoder circuit 44 to a coder 46 in FIG. 3 is equivalent to the simulation of the PCM-ADPCM transcoding of the next station which is to be connected via a transmission line subsequent to the decoder 3.

There occurs no change in the code value of a PCM signal due to such an effect even if the PCM-ADPCM transcoding is executed. This method is irrelevant to whether or not the coding and decoding is an adaptive type using a linear quantization step or using a non-linear quantization step. It can make the code value of an output signal equal to that of an input signal whether or not the prediction circuit is a fixed prediction or an adaptive prediction.

Figure 4:
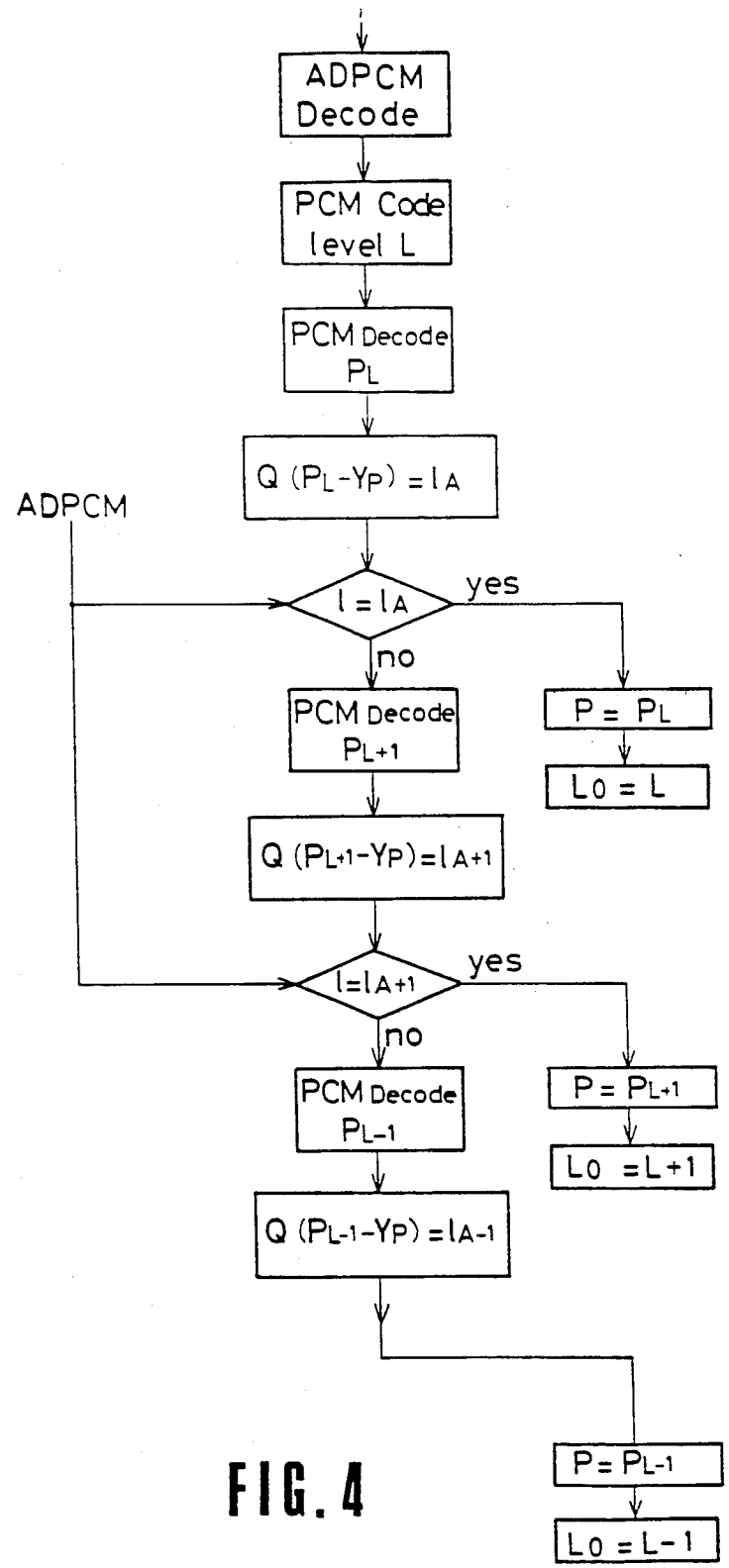
FIG. 4 is a flow chart showing the decoding process of a microprocessor.

The description in the foregoing is given for the case where the decoding process is executed by hardware, but this invention is also applicable to the case where it is processed in real-time by a micro-processor. The flow chart in FIG. 4 shows the operation therefor. An input data is decoded for ADPCM first and then the result is PCM coded. The PCM data is decoded for PCM to obtain the data PL. The data PL and the prediction data YP are operated per the formula below to obtain a nominal value $$Q(PL-YP) = 1A$$

wherein Q is a quantization function of ADPCM. If the operation of one step higher or lower than level L is performed, the above three data are obtained. These three data are sequentially decoded and compared with the ADPCM data to select one which is equal thereto. $L_0$ denotes an output level, L a nominal value, $L+1$ a level one step higher and $L-1$ a level one step lower. This process is the same as the process executed in the hardware process.

If algorithmic process are accompanied with little operational errors, the probablility that the nominal value L out of the three data is selected is the highest. Therefore, in comparison, the nominal value is selected first and if it is equal, the rest of the process for the level one step higher or lower may be omitted.

If it is not equal to the nominal value in the comparison, it should only detect the results of comparison for size larger or smaller. If it is larger, a step higher by one step is selected and if it is smaller a step lower by one step is selected, thereby omitting the comparison process for other data.

When the input ADPCM signal and the coded ADPCM signal which includes prediction are compared in the above case, as it is sufficient to detect the coincidence between them in logic levels even if the comparison is not necessarily executed at the ADPM signal level, the mode of signals to be input for comparison may be varied.

Figure 5:
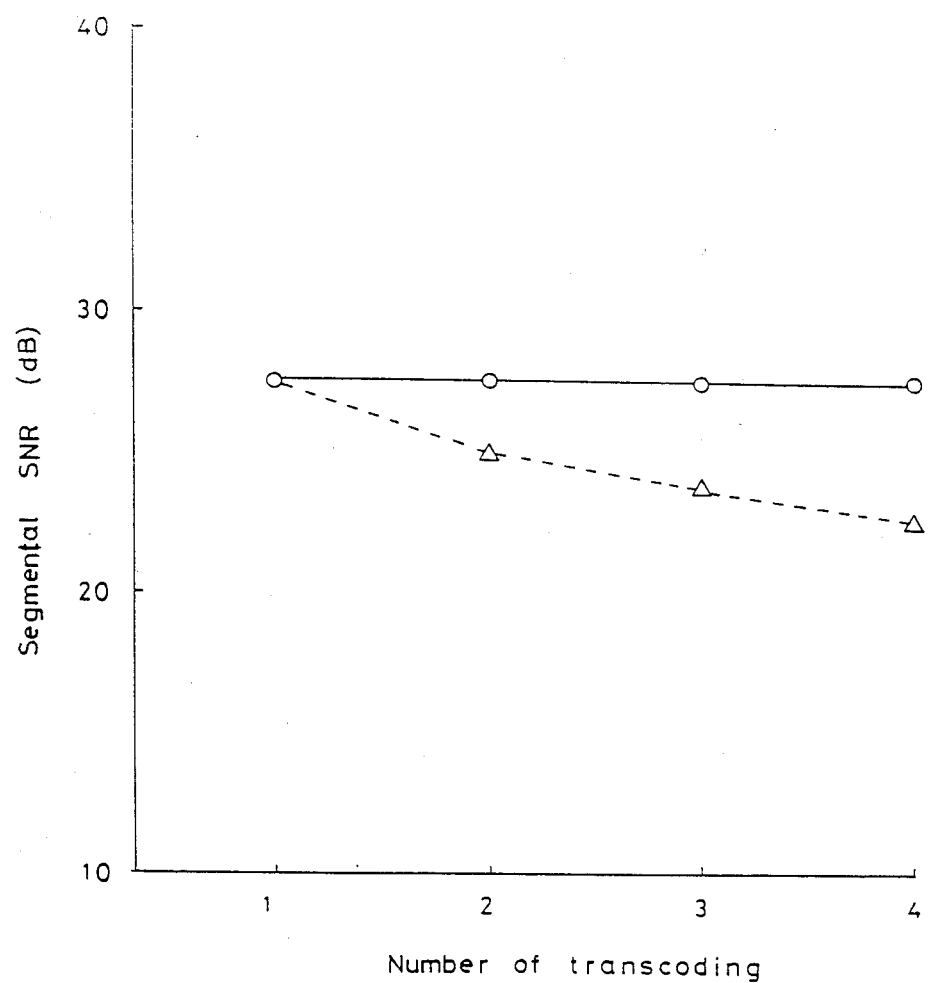
FIG. 5 shows the result of measurement of segmental signal to noise ratio when speech signal is fed to the embodiments of this invention.

The result of an example of an embodiment according to the present invention will now be shown below. FIG. 5 shows the result of the measurement of segmental signal to noise ratio when the speech signal in Japanese conversation is fed to an embodiment of this invention. In the graph, the horizontal axis represents the number of steps of transcoding. In this example, the used coder was an adaptive non-linear type with the minimal step set equal to the minimum value of the PCM step size, and the prediction circuit used was an adaptive prediction type. The input PCM signals are $\mu$—law PCM according to CCITT recommendation G.711. The solid line represents a device operating according to the present invention, while the dotted line represents the case where the prior art transcoding method was applied. It is clearly shown, therefore, that even if transcoding is repeated, cumulative noises do not occur when the present invention is employed.

What is claimed is:

1. A decoder for adaptive differential pulse code modulation (ADPCM) input signals developed with a predetermined prediction logic, comprising:

means for decoding an input ADPCM signal, means for adding a prediction signal to the output signal from said decoding means, prediction means fed with an output signal from said adding means for generating said prediction signal at a logic equal to said predetermined prediction logic and supplying said prediction signal to an input of said adding means for adding therein as aforesaid, coding means for coding the output signal from said adding means as a PCM signal having a nominal code value, and, transcoding means operative on three signals namely said ADPCM signal, said prediction signal and said nominal valued PCM signal for developing a desired PCM signal, including:

means for generating a PCM signal having a value one step higher than said nominal code value and a PCM signal having a value one step lower than said nominal value, means for selecting one of the said nominal higher and lower valued PCM signals, second decoding means for decoding the selected PCM signal from said selecting means, substraction means for subtracting the output signal of said decoding means and the output prediction signal from said prediction means, second means for coding said subtraction into an ADPCM signal having a logical value, by a step size of said input ADPCM signal, means for comparing the logical value of the output ADPCM signal from said second coding means with that of said input ADPCM signal, and gate means for gating out the output PCM signal from said selecting means when the comparing means has an equal output.

2. The decoder for adaptive differential pulse code modulation signals as claimed in claim 1 wherein said selecting means selects all said three signals, and said comparing means compares all of them to discriminate an equal one.

3. The decoder for adaptive differential pulse code modulation signals as claimed in claim 1 wherein said selecting means selects the nominal valued PCM signal and omits selection for the other two of said three signals when said comparing means has an equal output.

4. The decoder for adaptive differential pulse code modulation signals as claimed in claim 3 wherein said selecting means selects the nominal valued PCM signal first, said comparing means detects whether the level output of said coded ADPCM signal is larger or smaller and when an equal output is not obtained detects the level of said input ADPCM signal, and said selecting means selects either the data of said one step higher or the data of said one step lower depending on the result of the dimensional detection of said selecting means.

5. The decoder for adaptive differential pulse code modulation signals as claimed in claim 1 wherein said prediction means conducts adaptive prediction.

6. The decoder for adaptive differential pulse code modulation signals as claimed in claim 1 wherein the input ADPCM signal is coded by a non-linear quantization step and makes the step adaptively vary corresponding to an input signal.

* * * * *